United States Patent
Zha et al.

(10) Patent No.: US 10,355,163 B1
(45) Date of Patent: Jul. 16, 2019

(54) FLEXIBLE LED DEVICE AND METHOD FOR MANUFACTURING SAME

(71) Applicant: SHENZHEN CHINA STAR OPTOELECTRONICS TECHNOLOGY CO., LTD., Guangdong (CN)

(72) Inventors: Bao Zha, Guangdong (CN); Yi Zeng, Guangdong (CN)

(73) Assignee: SHENZHEN CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 15/761,110

(22) PCT Filed: Mar. 9, 2018

(86) PCT No.: PCT/CN2018/078493
§ 371 (c)(1),
(2) Date: Mar. 19, 2018

(30) Foreign Application Priority Data

Jan. 30, 2018 (CN) .......................... 2018 1 0087983

(51) Int. Cl.
*H01L 33/00* (2010.01)
*H01L 33/36* (2010.01)
*H01L 33/24* (2010.01)
*H01L 33/44* (2010.01)
*H01L 27/15* (2006.01)
*H01L 33/26* (2010.01)

(52) U.S. Cl.
CPC .......... *H01L 33/005* (2013.01); *H01L 27/153* (2013.01); *H01L 33/002* (2013.01); *H01L 33/24* (2013.01); *H01L 33/26* (2013.01); *H01L 33/36* (2013.01); *H01L 33/44* (2013.01); *H01L 2933/0016* (2013.01); *H01L 2933/0025* (2013.01)

(58) Field of Classification Search
CPC ..... H01L 27/153; H01L 33/005; H01L 33/24; H01L 33/26; H01L 33/36; H01L 33/44
USPC .................................................... 257/43, 98
See application file for complete search history.

(56) References Cited

U.S. PATENT DOCUMENTS

2009/0032834 A1* 2/2009 Ouyang .................. H01L 33/20
257/103

\* cited by examiner

*Primary Examiner* — Tan N Tran
(74) *Attorney, Agent, or Firm* — Mark M. Friedman

(57) ABSTRACT

The present disclosure provides a flexible light emitting diode (LED) device and a method for manufacturing the same. The method includes providing a p-type silicon wafer as a base, and then performing an exposure and development process to form a patterned layer including a plurality of p-type silicon microcolumns on the base; filling a plurality of gaps among the p-type silicon microcolumns with a soft polymer resin to form a compound layer; sequentially forming an n-type doped metal oxide layer and a first metal electrode layer on the compound layer; and removing the base, forming a second metal electrode layer, and then entirely shifting a whole body including these layers onto a flexible substrate.

12 Claims, 3 Drawing Sheets

FLEXIBLE LED DEVICE AND METHOD FOR MANUFACTURING SAME

FIELD OF INVENTION

The present disclosure relates to the field of display device, and more particularly to a flexible light emitting diode (LED) device and a method for manufacturing the same.

BACKGROUND

Light emitting diodes are semiconductor light emitting devices which convert electrical energy to light energy. LEDs, like ordinary diodes, includes a p-n junction, and emit light using semiconductor as a light emitting material. Holes from a p-region and electrons from an n-region combine in semiconductor material, such that excess energy is released and photons are emitted. Because different semiconductor materials have different bandgaps and holes and electrons have different energy states, different energy is released while holes and electrons are combined. Therefore, lights having different wavelengths can be produced.

With advancement of technology, performance of LED is increased, and LEDs are widely used in different fields, such as lighting, decoration, backlight source, and landscape lighting. However, some challenges are faced due to such fast development of LEDs. First, since the era of low carbon economy is coming, it is necessary to develop LEDs that are more economical. Secondly, since LEDs are rigid and are not pliable and LEDs cannot be used in some applications, it is required to develop flexible LEDs.

For achieving flexibility of LEDs, OLEDs are currently adopted because they have excellent flexibility. However, process conditions for producing OLED are strict, and it is difficult to manufacture large sized displays. On the other hand, conventional inorganic semiconductor LEDs still have the problem that semiconductor silicon material thereof is too rigid, in particular under the circumstance when the displays have to be bended.

SUMMARY OF DISCLOSURE

The present disclosure provides a flexible light emitting diode (LED) device and a method for manufacturing the same. The LED devices of the present disclosure that is flexible can be applied in more various fields than the conventional rigid LED devices could. Moreover, the flexible LED devices of the present disclosure can be manufactured by a more uncomplicated process and have the advantage of being energy saving.

To solve the above mentioned problems, the present disclosure provides the following technical schemes.

In a first aspect, the present disclosure provides a method for manufacturing a flexible light emitting diode (LED) device, including:

a step S1 of providing a p-type silicon wafer as a base, coating a photoresist layer on the base, and then performing an exposure and development process to form a patterned layer including a plurality of p-type silicon microcolumns on the base, wherein at least a portion of the p-type silicon wafer is configured as the base, and an other portion of the p-type silicon wafer is patterned to form the p-type silicon microcolumns in unison; and the p-type silicon microcolumns are uniformly distributed on the base;

a step S2 of filling a plurality of gaps among the p-type silicon microcolumns with a soft polymer resin to form a compound layer including the p-type silicon microcolumns and the soft polymer resin;

a step S3 of sequentially forming an n-type doped metal oxide layer and a first metal electrode layer on the compound layer, and a step S4 of removing the base, forming a second metal electrode layer on a side surface of the compound layer where the base is removed, and then entirely shifting a whole body including the compound layer, the first metal electrode layer, the second metal electrode layer, and the n-type doped metal oxide layer onto a flexible substrate, such that the flexible LED device is produced.

In accordance with one preferred embodiment of the present disclosure, after the step S2, the method further includes:

etching the compound layer, such that the p-type silicon microcolumns and the soft polymer resin are coplanar.

In accordance with one preferred embodiment of the present disclosure, in the step S3, an ion magnetron sputtering process is performed to deposit the n-type doped metal oxide layer on the compound layer, such that a p-n junction is formed between the n-type doped metal oxide layer and the p-type silicon microcolumns.

In a second aspect, the present disclosure provides a flexible light emitting diode (LED) device manufactured according to the above mentioned method, including:

a flexible substrate including a display region;

an anode layer disposed on the flexible substrate and corresponding to the display region;

a compound layer disposed on the anode layer, wherein the compound layer includes a soft polymer resin and a plurality of p-type silicon microcolumns;

an n-type doped metal oxide layer disposed on the compound layer; and a cathode layer disposed on the n-type doped metal oxide layer;

wherein the p-type silicon microcolumns are uniformly distributed in the compound layer and pass through the soft polymer resin, and the p-type silicon microcolumns and the n-type doped metal oxide layer constitute a p-n junction.

In accordance with one preferred embodiment of the present disclosure, a diameter of each of the p-type silicon microcolumns is 0.5-10 μm.

In accordance with one preferred embodiment of the present disclosure, a height of each of the p-type silicon microcolumns is 5-100 Gun.

In accordance with one preferred embodiment of the present disclosure, an interval between two of the p-type silicon microcolumns adjacent to each other is 2-20 μm.

In accordance with one preferred embodiment of the present disclosure, each of the p-type silicon microcolumns has a shape of a cylinder, a prism, a round table, or a ridge.

In accordance with one preferred embodiment of the present disclosure, the soft polymer resin is made of a material selected from poly(methyl methacrylate), polydimethylsiloxane, flexible epoxy resin, flexible polyimide, or any combination thereof.

In a third aspect, the present disclosure provides a method for manufacturing a flexible light emitting diode (LED) device, including:

a step S1 of providing a p-type silicon wafer as a base, coating a photoresist layer on the base, and then performing an exposure and development process to form a patterned layer including a plurality of p-type silicon microcolumns on the base;

a step S2 of filling a plurality of gaps among the p-type silicon microcolumns with a soft polymer resin to form a compound layer including the p-type silicon microcolumns and the soft polymer resin;

a step S3 of sequentially forming an n-type doped metal oxide layer and a first metal electrode layer on the compound layer; and a step S4 of removing the base, forming a second metal electrode layer on a side surface of the compound layer where the base is removed, and then entirely shifting a whole body including the compound layer, the first metal electrode layer, the second metal electrode layer, and the n-type doped metal oxide layer onto a flexible substrate, such that the flexible LED device is produced.

In accordance with one preferred embodiment of the present disclosure, after the step S2, the method further includes:

etching the compound layer, such that the p-type silicon microcolumns and the soft polymer resin are coplanar.

In accordance with one preferred embodiment of the present disclosure, in the step S3, an ion magnetron sputtering process is performed to deposit the n-type doped metal oxide layer on the compound layer, such that a p-n junction is formed between the n-type doped metal oxide layer and the p-type silicon microcolumns.

The present disclosure provides a flexible LED device and a method for manufacturing the same. According to the present disclosure, a portion of the p-type silicon wafer is configured as a base, and an other portion of the p-type silicon wafer is patterned to form a plurality of p-type silicon microcolumns. Next, a plurality of gaps among the p-type silicon microcolumns is filled with a soft polymer resin to form a compound layer including the p-type silicon microcolumns and the soft polymer resin. Thereafter, other steps are performed to finish production of the LED devices. The present disclosure solves the problems encountered by the prior art, where when conventional LED devices are bended, display qualities of conventional LED devices are influenced due to rigidity of silicon materials of conventional LED devices. Compared to the prior art, the present disclosure is characterized in a compound layer which is flexible and still possesses original properties of semiconductor silicon materials. Thus, the LED devices of the present disclosure that is flexible can be applied in more various fields than the conventional rigid LED devices could. Moreover, the flexible LED devices of the present disclosure emit lights uniformly, and can be manufactured by a more uncomplicated process and make large-scale production practicable. Furthermore, the flexible LED devices of the present disclosure, in addition to being flexible, have the advantage of being energy saving.

BRIEF DESCRIPTION OF DRAWINGS

To explain in detail the technical schemes of the embodiments or existing techniques, drawings that are used to illustrate the embodiments or existing techniques are provided. The illustrated embodiments are just a part of those of the present disclosure. It is easy for any person having ordinary skill in the art to obtain other drawings without labor for inventiveness.

DETAILED DESCRIPTION

Figure 1:
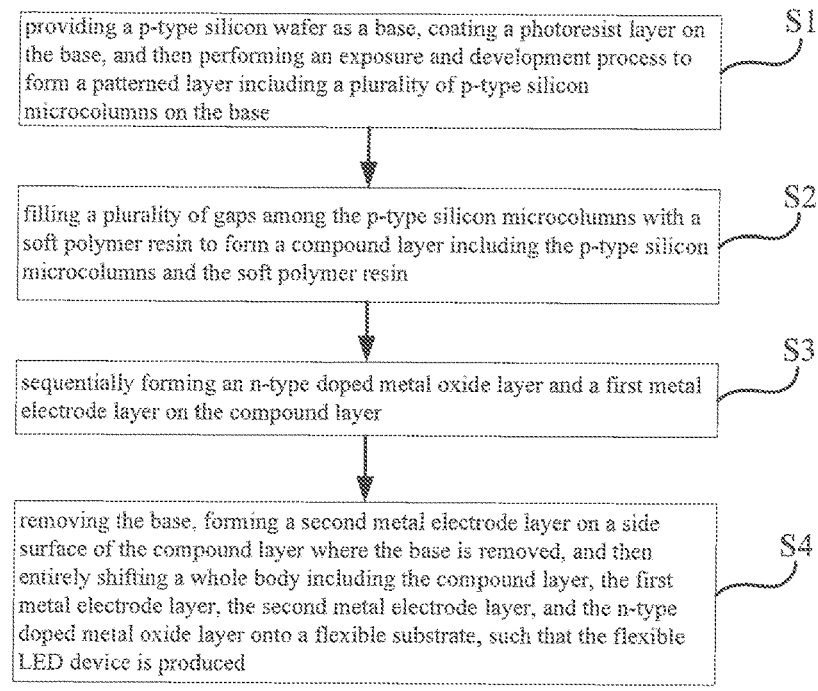
FIG. 1 shows a process flow of a method for manufacturing a flexible light emitting diode (LED) device according to the present disclosure.
Figure 2A:
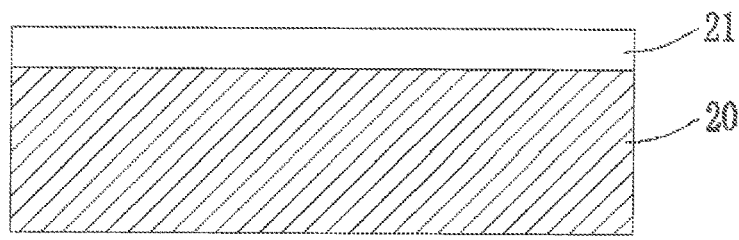
FIG. 2A to FIG. 2F show each step in a process of a method for manufacturing a flexible light emitting diode (LED) device according to the present disclosure.
Figure 2B:
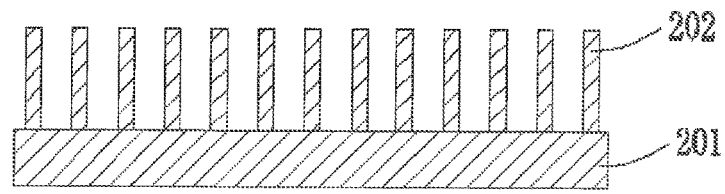
Figure 2C:
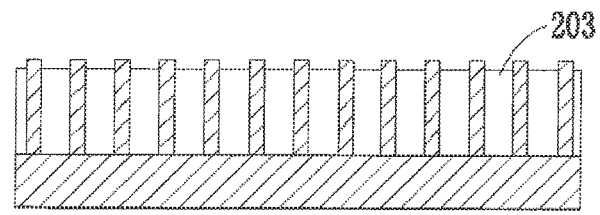
Figure 2D:
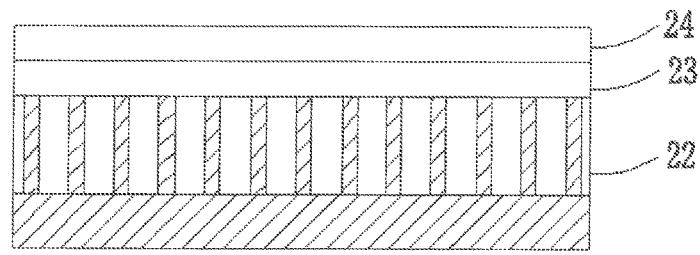
Figure 2E:
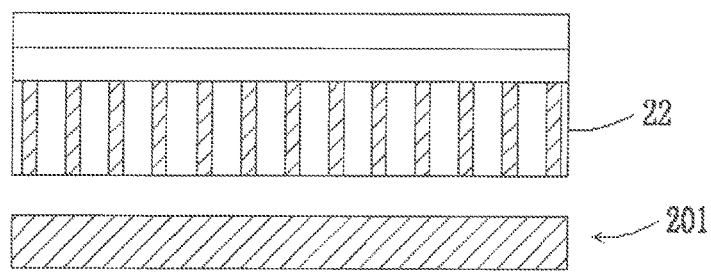
Figure 2F:
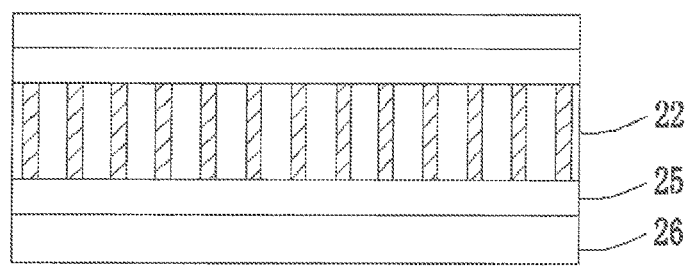

The following embodiments refer to the accompanying drawings for exemplifying specific implementable embodiments of the present disclosure. Moreover, directional terms described by the present disclosure, such as upper, lower, front, back, left, right, inner, outer, side, etc., are only directions by referring to the accompanying drawings, and thus the used directional terms are used to describe and understand the present disclosure, but the present disclosure is not limited thereto. In the drawings, the same reference symbol represents the same or similar components.

Please refer to FIG. 1, where FIG. 1 shows a process flow of a method for manufacturing a flexible light emitting diode (LED) device according to the present disclosure. The method includes:

a step S1 of providing a p-type silicon wafer as a base, coating a photoresist layer on the base, and then performing an exposure and development process to form a patterned layer including a plurality of p-type silicon microcolumns on the base;

a step S2 of filling a plurality of gaps among the p-type silicon microcolumns with a soft polymer resin to form a compound layer including the p-type silicon microcolumns and the soft polymer resin;

a step S3 of sequentially forming an n-type doped metal oxide layer and a first metal electrode layer on the compound layer; and a step S4 of removing the base, forming a second metal electrode layer on a side surface of the compound layer where the base is removed, and then entirely shifting a whole body including the compound layer, the first metal electrode layer, the second metal electrode layer, and the n-type doped metal oxide layer onto a flexible substrate, such that the flexible LED device is produced.

Specifically, please refer to FIGS. 2A-2F, which show each step in a process of a method for manufacturing a flexible light emitting diode (LED) device according to the present disclosure. First, a square p-type silicon wafer 20 is provided. Next, a photoresist material is spin-coated on a surface of the p-type silicon wafer 20 to form a photoresist layer 21 thereon. At least a portion of the p-type silicon wafer 20 is configured as the base 201, and an other portion of the p-type silicon wafer is patterned by an exposure and development process to form the p-type silicon microcolumns 202 in unison on the base 201. The p-type silicon microcolumns 202 are uniformly distributed on the base 201, such that there is an interval between two adjacent p-type silicon microcolumns 202. Then, a soft polymer resin 203 is used to fill the gap among the p-type silicon microcolumns 202, so as to form a compound layer 22 including the p-type silicon microcolumns 202 and the soft polymer resin 203. The compound layer 22 covers the base 201. Thereafter, the compound layer 22 is etched to remove top portions of the p-type silicon microcolumns 202 which are higher than the soft polymer resin 203, so as to have the upper surface of the compound layer 22 planar. Oxygen plasma etching process can be used to perform the etching. Then, an ion magnetron sputtering process is performed to deposit an n-type doped metal oxide layer 23 on the upper surface of the compound layer 22, such that a p-n junction is formed between the n-type doped metal oxide layer 23 and the p-type silicon microcolumns 202. Subsequently, a first metal electrode layer 24 is formed on the n-type doped metal oxide layer 23. The first metal electrode layer 24 is configured as a cathode layer of the LED device. Then, the base 201 is mechanically removed from the compound layer 22. Preferably, removal of the base 201 exposes the soft polymer resin 203, and maintains a side surface of the compound layer 22 where the base 201 is removed smooth and inseparate. Then, a second metal electrode layer 25 is formed on a side surface of the compound layer 22 where the base 201 is removed. The second metal electrode layer 25 is configured as an anode layer of the LED device. Finally, a whole body including the compound layer 22, the first metal electrode layer 24, the second metal electrode layer 25, and the n-type doped metal oxide layer 23 is entirely shifted onto a flexible substrate 26 made of poly(ethylene terephthalate) (PET), such that the flexible LED device is produced.

Preferably, the photoresist material is a positive type photoresist material. The photoresist layer has a thickness of 100-300 nm. By performing an etching step, a portion of the p-type silicon wafer 20 that is disposed under the photoresist material after the exposure and development process is performed can be removed. Alternatively, a negative type photoresist material can be used. With etching, a plurality of p-type silicon microcolumns 202 are formed in unison. Preferably, removal of the base 201 can have the soft polymer resin 203 not exposed as well.

The soft polymer resin 203 evenly fills the gap among the p-type silicon microcolumns 202, so that the compound layer 22 is formed. Preferably, the soft polymer resin 203 is made of a material selected from poly(methyl methacrylate) (PMMA), polydimethylsiloxane (PDMS), flexible epoxy resin, flexible polyimide, or any combination thereof.

The n-type doped metal oxide layer 23 has a thickness of 200-500 nm. Preferably, the n-type doped metal oxide layer 23 is made of a material selected from ZnO, $Cu_2O$, $SnO_2$, $Fe_2O_3$, $TiO_2$, $ZrO_2$, CoO, $WO_3$, $In_2O_3$, $Al_2O_3$, $Fe_3O_4$, or any combination thereof. Bandgaps between different n-type doped metal oxides and different p-type semiconductor silicon are different, which correspondingly emit lights having different wavelengths. The first metal electrode layer 24 and the second metal electrode layer 25 can be made of a metal conductor selected from graphene, Ag, Al, Cu, or Zn, and can be a metal compound layer including any thereof.

Figure 3:
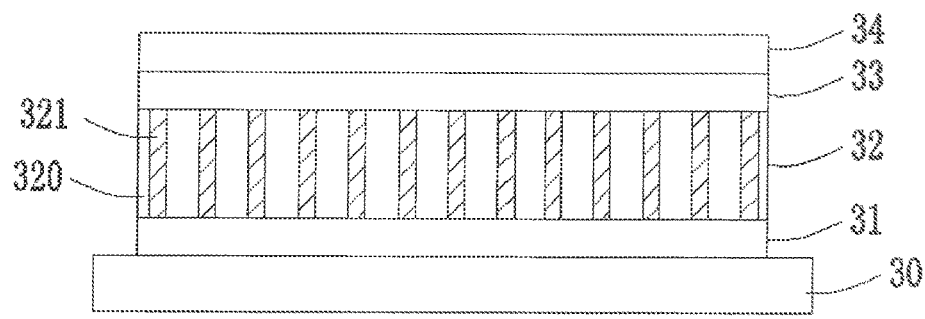
FIG. 3 is a schematic diagram showing a structure of a flexible light emitting diode (LED) device according to an embodiment of the present disclosure.

Please refer to FIG. 3. The present disclosure further provides a flexible light emitting diode (LED) device manufactured according to the above said method. The flexible LED device includes a flexible substrate 30 including a display region; an anode layer 31 disposed on the flexible substrate 30 and corresponding to the display region; a compound layer 32 disposed on the anode layer 31, wherein the compound layer 32 includes a soft polymer resin 320 and a plurality of p-type silicon microcolumns 321; an n-type doped metal oxide layer 33 disposed on the compound layer 32; and a cathode layer 34 disposed on the n-type doped metal oxide layer 33. The p-type silicon microcolumns 321 are uniformly distributed in the compound layer 32 and pass through the soft polymer resin 320, so that two ends of the p-type silicon microcolumns 321 contact the anode layer 31 and the n-type doped metal oxide layer 33, respectively. In addition, the p-type silicon microcolumns 321 and the n-type doped metal oxide layer 33 constitute a p-n junction, therefore the anode layer 31 and the cathode layer 34 are electrically connected to each other.

A diameter of each of the p-type silicon microcolumns 321 is 0.5-10 μm, preferably 2-6 μm. A height of each of the p-type silicon microcolumns 321 is 5-100 μm, preferably 20-80 μm. Moreover, an interval between two of the p-type silicon microcolumns 321 adjacent to each other is 2-20 μm, preferably 5-12 μm. Each of the p-type silicon microcolumns 321 has a shape of a cylinder, a prism, a round table, or a ridge, but the shape of the p-type silicon microcolumns 321 is not limited thereto.

According to the present disclosure, the semiconductor silicon material in the LED device is combined with the polymer resin. Such design would not influence original properties of the semiconductor silicon material, and can mitigate rigidity of the semiconductor silicon material because of inclusion of flexible material. Thus, the semiconductor silicon material, when bended, will not be damaged. In the above described embodiment of the present disclosure, the p-type silicon material is patterned to have a form of p-type silicon microcolumns. It could be understood that the p-type silicon material can be formed to have different acceptable shapes or forms, and such shapes can combine with the flexible organic materials, solving the problem where the silicon material is too rigid when bended.

To replace the conventional LED devices, the present disclosure provides a flexible LED device and a method for manufacturing the same. According to the present disclosure, a portion of the p-type silicon wafer is configured as a base, and an other portion of the p-type silicon wafer is patterned to form a plurality of p-type silicon microcolumns. Next, a plurality of gaps among the p-type silicon microcolumns is filled with a soft polymer resin to form a compound layer including the p-type silicon microcolumns and the soft polymer resin. Then, an n-type doped metal oxide layer is formed for forming a p-n junction. Subsequently, the base is mechanically removed. Finally, after formation of electrodes is finished, a whole body including these layers is shifted onto a flexible substrate made of PET, so that a flexible LED device is produced. The present disclosure solves the problems encountered by the prior art, where when conventional LED devices are bended, display qualities of conventional LED devices are influenced due to rigidity of silicon materials of conventional LED devices. Compared to the prior art, the present disclosure is characterized in a compound layer which is flexible and still possesses original properties of semiconductor silicon materials. Thus, the LED devices of the present disclosure that is flexible can be applied in more various fields than the conventional rigid LED devices could. Moreover, the flexible LED devices of the present disclosure emit lights uniformly, and can be manufactured by a more uncomplicated process and make large-scale production practicable. Furthermore, the flexible LED devices of the present disclosure, in addition to being flexible, have the advantage of being energy saving.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. A method for manufacturing a flexible light emitting diode (LED) device, comprising:
    a step S1 of providing a p-type silicon wafer as a base, coating a photoresist layer on the base, and then performing an exposure and development process to form a patterned layer including a plurality of p-type silicon microcolumns on the base, wherein at least a portion of the p-type silicon wafer is configured as the base, and another portion of the p-type silicon wafer is patterned to form the p-type silicon microcolumns in unison; and the p-type silicon microcolumns are uniformly distributed on the base;

a step S2 of filling a plurality of gaps among the p-type silicon microcolumns with a soft polymer resin to form a compound layer including the p-type silicon microcolumns and the soft polymer resin;

a step S3 of sequentially forming an n-type doped metal oxide layer and a first metal electrode layer on the compound layer; and a step S4 of removing the base, forming a second metal electrode layer on a side surface of the compound layer where the base is removed, and then entirely shifting a whole body including the compound layer, the first metal electrode layer, the second metal electrode layer, and the n-type doped metal oxide layer onto a flexible substrate, such that the flexible LED device is produced.

2. The method according to claim 1, wherein, after the step S2, the method further comprises:

etching the compound layer, such that the p-type silicon microcolumns and the soft polymer resin are coplanar.

3. The method according to claim 1, wherein, in the step S3, an ion magnetron sputtering process is performed to deposit the n-type doped metal oxide layer on the compound layer, such that a p-n junction is formed between the n-type doped metal oxide layer and the p-type silicon microcolumns.

4. A flexible light emitting diode (LED) device manufactured according to the method of claim 1, comprising:

a flexible substrate including a display region;

an anode layer disposed on the flexible substrate and corresponding to the display region;

a compound layer disposed on the anode layer, wherein the compound layer includes a soft polymer resin and a plurality of p-type silicon microcolumns;

an n-type doped metal oxide layer disposed on the compound layer; and a cathode layer disposed on the n-type doped metal oxide layer;

wherein the p-type silicon microcolumns are uniformly distributed in the compound layer and pass through the soft polymer resin, and the p-type silicon microcolumns and the n-type doped metal oxide layer constitute a p-n junction.

5. The flexible LED device according to claim 4, wherein a diameter of each of the p-type silicon microcolumns is 0.5-10 µm.

6. The flexible LED device according to claim 4, wherein a height of each of the p-type silicon microcolumns is 5-100 µm.

7. The flexible LED device according to claim 4, wherein an interval between two of the p-type silicon microcolumns adjacent to each other is 2-20 µm.

8. The flexible LED device according to claim 4, wherein each of the p-type silicon microcolumns has a shape of a cylinder, a prism, a round table, or a ridge.

9. The flexible LED device according to claim 4, wherein the soft polymer resin is made of a material selected from poly(methyl methacrylate), polydimethylsiloxane, flexible epoxy resin, flexible polyimide, or any combination thereof.

10. A method for manufacturing a flexible light emitting diode (LED) device, comprising:

a step S1 of providing a p-type silicon wafer as a base, coating a photoresist layer on the base, and then performing an exposure and development process to form a patterned layer including a plurality of p-type silicon microcolumns on the base;

a step S2 of filling a plurality of gaps among the p-type silicon microcolumns with a soft polymer resin to form a compound layer including the p-type silicon microcolumns and the soft polymer resin;

a step S3 of sequentially forming an n-type doped metal oxide layer and a first metal electrode layer on the compound layer; and a step S4 of removing the base, forming a second metal electrode layer on a side surface of the compound layer where the base is removed, and then entirely shifting a whole body including the compound layer, the first metal electrode layer, the second metal electrode layer, and the n-type doped metal oxide layer onto a flexible substrate, such that the flexible LED device is produced.

11. The method according to claim 10, wherein, after the step S2, the method further comprises:

etching the compound layer, such that the p-type silicon microcolumns and the soft polymer resin are coplanar.

12. The method according to claim 10, wherein, in the step S3, an ion magnetron sputtering process is performed to deposit the n-type doped metal oxide layer on the compound layer, such that a p-n junction is formed between the n-type doped metal oxide layer and the p-type silicon microcolumns.

* * * * *